(12) United States Patent
Ravinuthula et al.

(10) Patent No.: US 12,341,525 B2
(45) Date of Patent: Jun. 24, 2025

(54) CONFIGURABLE FREQUENCY-LOCKED LOOP/PHASE-LOCKED LOOP OSCILLATOR

(71) Applicant: TEXAS INSTRUMENTS INCORPORATED, Dallas, TX (US)

(72) Inventors: Vishnu Ravinuthula, Dallas, TX (US); Peng Cao, Allen, TX (US); Chienyu Huang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/326,245

(22) Filed: May 31, 2023

(65) Prior Publication Data

US 2024/0405778 A1    Dec. 5, 2024

(51) Int. Cl.
*H03L 7/099*      (2006.01)
*H03L 7/00*       (2006.01)
*H03L 7/093*      (2006.01)

(52) U.S. Cl.
CPC .............. *H03L 7/099* (2013.01); *H03L 7/00* (2013.01); *H03L 7/093* (2013.01)

(58) Field of Classification Search
CPC ............ H03L 7/099; H03L 7/00; H03L 7/093
USPC ....................... 331/1 R, 16, 17, 34
See application file for complete search history.

(56) References Cited

U.S. PATENT DOCUMENTS

2019/0097641 A1*   3/2019   Gupta ................. H03L 7/087

OTHER PUBLICATIONS

A 10-GB/s Low Jitter Single-Loop Clock and Data Recovery Circuit With Rotational Phase-Frequency Detector, Fan-Ta Chen, et al., IEEE Transactions on Circuits and Systems-I: Regular Papers, col. 61, No. 11, Nov. 2014.

* cited by examiner

*Primary Examiner* — Arnold M Kinkead
(74) *Attorney, Agent, or Firm* — Charles F. Koch; Frank D. Cimino

(57) ABSTRACT

An integrated circuit (IC) includes an oscillator circuit having a control input. A control circuit has a control output coupled to the control input. The control circuit is configured to generate a control signal to the control input of the oscillator circuit to cause: the oscillator circuit to be configured as a frequency-locked loop in response to the control signal being in a first state; and the oscillator circuit to be configured as a phase-locked loop in response to the control signal being in a second state.

20 Claims, 9 Drawing Sheets

CONFIGURABLE FREQUENCY-LOCKED LOOP/PHASE-LOCKED LOOP OSCILLATOR

BACKGROUND

Many systems include multiple converters that need to be operated synchronously with one another. For example, an electric vehicle (EV) has numerous battery cells whose voltages combine to produce the voltage (e.g., 400V, 800V, etc.) for the vehicle. A battery monitor may be coupled to subsets of the battery cells. Each battery monitor can measure the voltage of each of the cells to which that battery monitor is coupled. Another monitor in the EV may measure current through the stack of battery cells. A potential failure mode of a battery cell is "thermal runaway" in which the cell overheats. A dramatic change in the impedance of a cell can be a predictor of future thermal runaway of that cell. Determining a battery cell's impedance includes measuring its voltage while also measuring the current through the cells. The ratio of voltage to current is impedance. Each of the monitors includes one or more analog-to-digital converters (ADCs), which sample the analog input signal (voltage or current) and convert the analog sample to a digital value. ADCs have a clock input. To synchronize the measurements of cell voltage and cell stack current, the clocks of the various monitors should be synchronized.

SUMMARY

An integrated circuit (IC) includes an oscillator circuit having a control input. A control circuit has a control output coupled to the control input. The control circuit is configured to generate a control signal to the control input of the oscillator circuit to cause: the oscillator circuit to be configured as a frequency-locked loop in response to the control signal being in a first state; and the oscillator circuit to be configured as a phase-locked loop in response to the control signal being in a second state.

DETAILED DESCRIPTION

Figure 1:
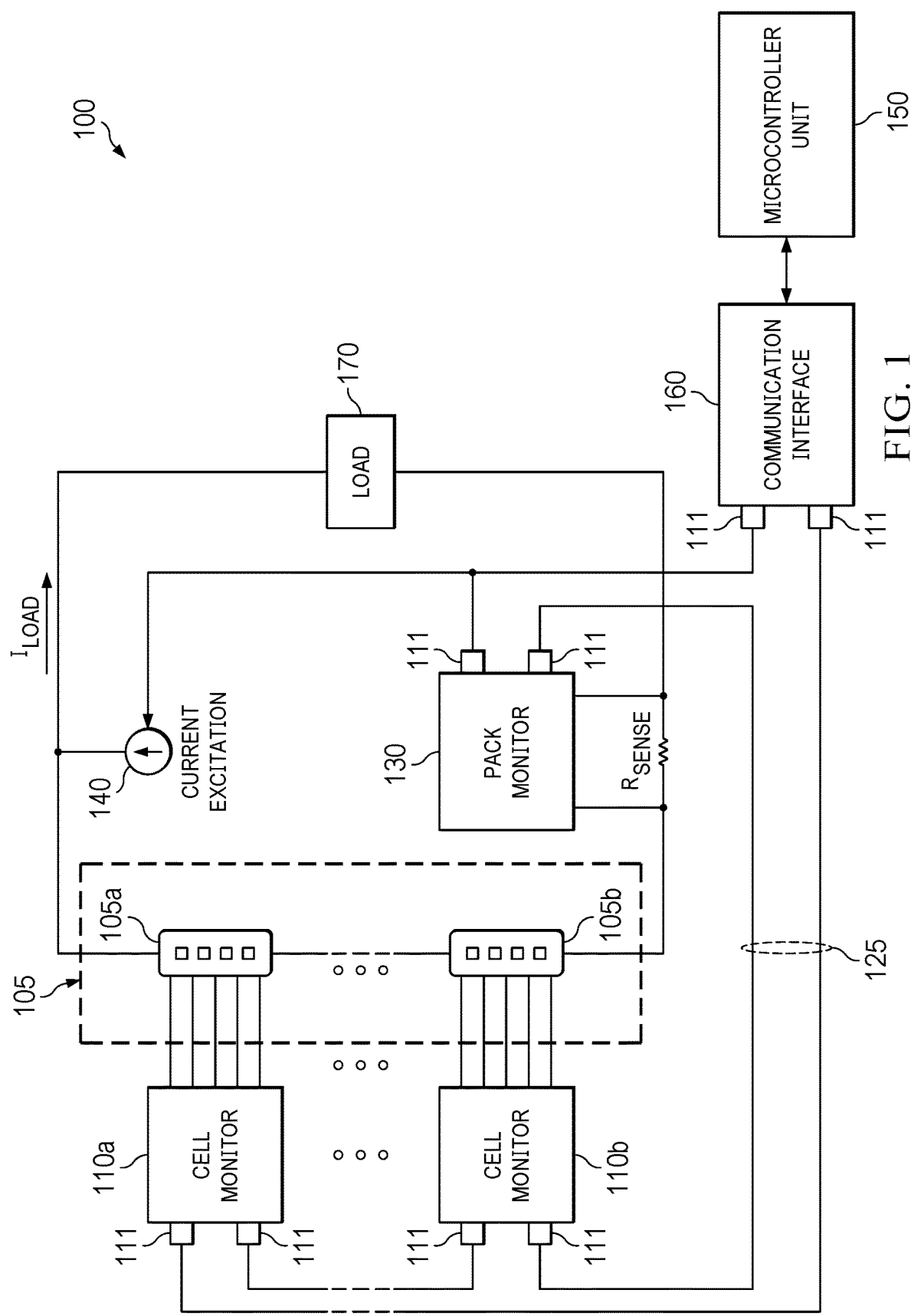
FIG. 1 is a schematic diagram of an example system having multiple battery cell monitors whose clocks are synchronized.

The same reference numbers or other reference designators are used in the drawings to designate the same or similar (either by function and/or structure) features.

The principles described herein for synchronizing clocks to multiple converters within a system can apply to numerous applications. The example application described herein is that of an electric vehicle (EV) or hybrid vehicle (HV). However, this disclosure is not limited to EVs or HVs.

FIG. 1 is a schematic diagram of a system 100 that can be included in an EV or HV. System 100 includes a battery system 105, a microcontroller unit (MCU) 150, a communication interface 160, and a load 170. The battery system 105 includes multiple battery cells grouped into multiple battery packs 105a, 105b, etc. (collectively battery packs 105). Although two battery packs 105a and 105b are shown, the battery system 105 can include any suitable number of battery packs. Each battery pack 105 includes multiple battery cells (e.g., 4 cells, 8 cells, etc.). The cells within each battery pack 105 may be coupled in series, and the battery packs 105 may be coupled in series to produce the voltage provided to load 170. In an EV or HV, load 170 can include a traction inverter coupled to an electric motor.

Each battery pack 105 may be coupled to a cell monitor. For example, battery pack 105a is coupled to cell monitor 110a, and battery pack 105b is coupled to cell monitor 110b. Each cell monitor 110a and 110b (collectively, cell monitors 110), can be implemented as an integrated circuit (IC). Each cell monitor 110a includes multiple monitoring channels, and each monitoring channel is coupled to an individual battery cell within the corresponding battery pack 105. Via each monitoring channel, cell monitor 110 can measure the voltage of battery cell coupled to that channel. In one example, each cell monitor 110 may include a separate analog-to-digital converter (ADC) for each monitoring channel. In another example, each cell monitor 110 may include one ADC that is time-multiplexed for use by all of the monitoring channels. Each ADC includes a clock input that receives a clock signal to control the operation of the ADC. Each ADC converts the battery cell's analog voltage to a digital value. The digital value is thus proportional to battery cell voltage.

System 100 also includes a sense resistor $R_{sense}$ and a pack monitor 130. Sense resistor $R_{sense}$ is connected in-line with the load current $I_{LOAD}$ that flows between the battery system 105 and load 170. The resistance of sense resistor $R_{sense}$ is low enough that only a small voltage (proportional to current) develops across the resistor. The sense resistor $R_{sense}$ is coupled to pack monitor 130. The pack monitor also includes an ADC to convert the sense resistor's voltage to a digital value. The digital value from the pack monitor's ADC is proportional to the load current $I_{LOAD}$.

The MCU 150 can provide commands to, and receive responses from, cell monitors 110 and pack monitor 130 via the communication interface 160 and a communication bus 125. Multiple architectural implementations are possible for communication bus 125. In the example of FIG. 1, communication bus 125 has a daisy-chained configuration. Each cell monitor 110, pack monitor 130, and communication interface 160 has two ports 111, and the ports 111 are coupled in a daisy-chained fashion. For example, one port of the communication interface 160, which forwards the command to one port of the pack monitor. The other port of the pack monitor 130 is coupled to one of the ports 111 of cell monitor 110b, and the other port of cell monitor 110b is coupled to a port of cell monitor 110a, and so on.

Via the communication interface 160, the MCU 150 can send a command to each of the pack monitor 130 and cell monitors 110. For example, the MCU 150 can send a read command to read registers within each cell monitor 110 and pack monitor 130 to obtain the digital values from the monitors' ADCs.

The MCU 150 can determine the impedance of each battery cell within battery packs 105. As noted above, determining impedance includes applying a current to the battery cells and measuring their resulting voltage due to the current. System 100 includes a current source 140 which can be commanded by the MCU 150 to force current through battery packs 105. The ADCs in the cell monitors 110 can measure the resulting voltage of each cell, and the ADC in the pack monitor 130 can measure the current through the battery packs. Each cell/pack monitor can perform a time domain-to-frequency domain conversion, such as a discrete Fourier transform, of the digital values representative of voltage and current and can store the resulting frequency domain representations in registers within the monitors for subsequent retrieval by the MCU 150. The MCU reads the digital values corresponding to the battery cell's voltages and the current (or their frequency domain representations) from the respective cell monitors 110 and pack monitor 130, and computes the impedance of each battery cell to determine, for example, whether a given cell may experience a thermal runaway condition in the near future. The current source 140 injects a sinusoidal current through the battery packs 105. The determination of impedance includes sampling, performing a discrete Fourier transform, and digitizing the analog sinusoidal voltages and current at the same point in time. To that end, the various ADCs in the cell monitors 110 and pack monitor 130 are clocked with clock signals (clocks) that are phase and frequency synchronized.

In some applications, clocks to multiple devices can be synchronized through the use of phase-locked loops (PLLs). A PLL has a reference clock input to which a reference clock is provided. The PLL synchronizes its output clock to the reference clock. In system 100 for an EV or HV, for example, providing a reference clock to the cell monitors 110 and pack monitor 130 is impractical due to the high voltage nature of the battery system and the typical use of transformers and chokes employed along the serially-connected stack of battery packs 105.

To enable the cell monitors 110 and pack monitor 130 to function without a typical reference clock, each of cell monitors 110 and pack monitor 130 described herein includes an oscillator circuit (described below) that can be switched between frequency-locked loop (FLL) operation and PLL operation. When the MCU 150 is using the communication bus 125 to communicate with the cell monitors 110 and pack monitor 130 (e.g., to provide commands or receive data), the oscillator circuits are configured to operate in FLL mode in which a reference clock is not needed. The output clocks from the oscillator circuits are used to clock the associated ADC in that monitor. When the MCU 150 is not otherwise using the communication bus 125 to communicate with the cell monitors 110 and pack monitor 130, the MCU 150 can command the communication interface 160 transmit a reference clock over the communication bus 125 to the cell monitors 110 and pack monitor 130. In this state, the oscillator circuits within the cell monitors 110 and pack monitor 130 are configured to operate as PLLs and to use the reference clock provided over the communication bus 125 as the reference clock to each PLL to synchronize the oscillator's output clock.

Figure 2:
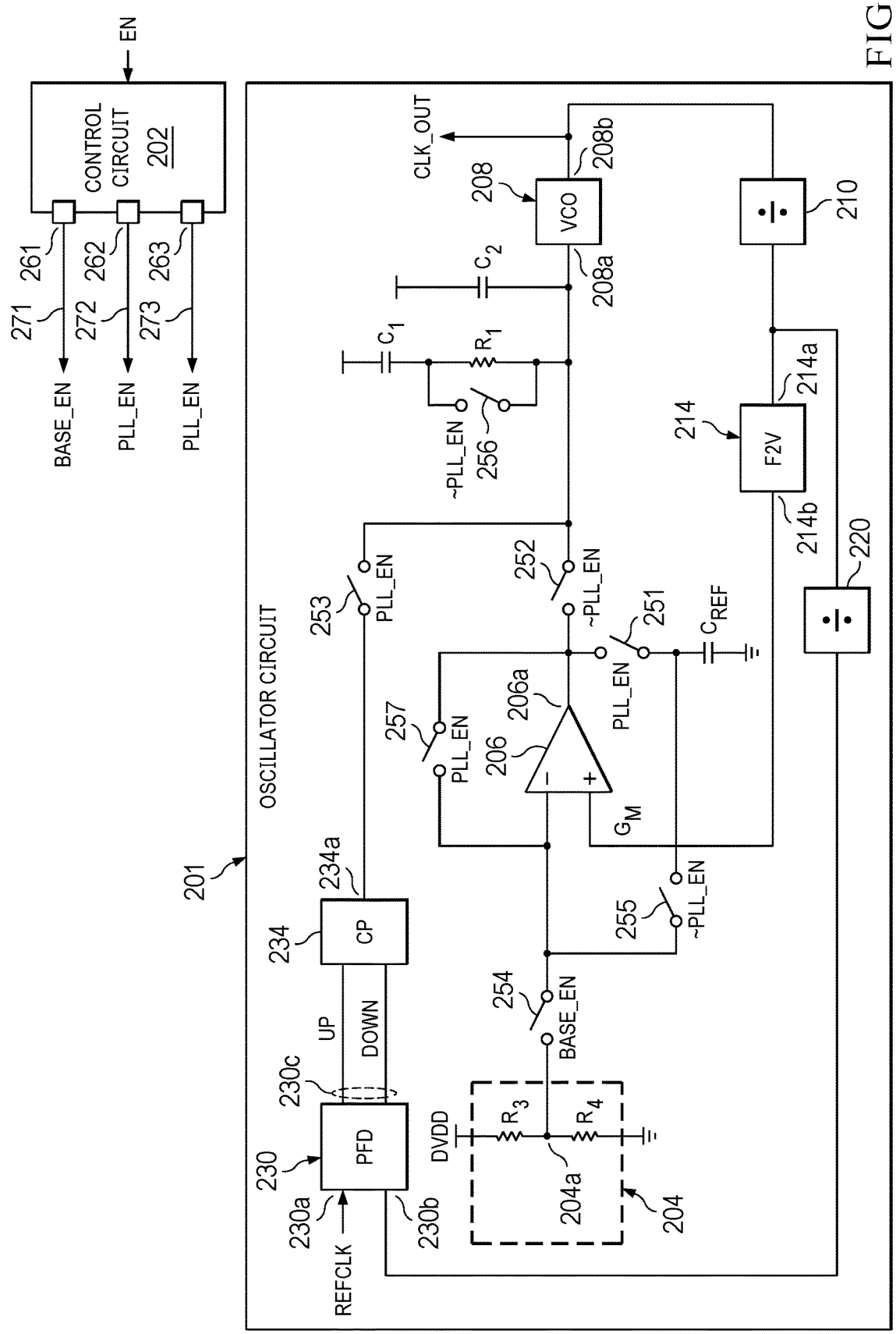
FIG. 2 is a schematic diagram of an example configurable oscillator circuit usable in the monitors of FIG. 1.

FIG. 2 is schematic diagram of an example oscillator circuit 201 that can be included within each cell monitor 110 and/or pack monitor 130. In FIG. 2, the oscillator circuit 201 is coupled to a control circuit 202. In one example, control circuit 202 can be implemented as a combination of Boolean logic (AND gates, OR gates, inverters, etc.) and sequential logic elements such as flip-flops. In another example, control circuit 202 can be implemented as a processor (e.g., microcontroller) executing software instructions (firmware) stored in memory. Control circuit 202 also can be implemented as a programmable logic device (PLD).

The oscillator circuit 201 includes a voltage divider 204, an amplifier 206, a voltage-controlled oscillator (VCO) 208, frequency dividers 210 and 220, a frequency-to-voltage (F2V) converter 214, a phase-frequency detector (PFD) 230, a charge pump (CP) 234, resistor $R_1$, capacitors $C_{REF}$, $C_1$ and $C_2$, and switches 251, 252, 253, 254, 255, 256, and 257. In the example of FIG. 2, voltage divider 204 includes resistors $R_3$ and $R_4$ coupled in series between a supply voltage (DVDD) terminal and ground. The output 204a of voltage divider is the connection between resistors $R_3$ and $R_4$. Amplifier 206 has a negative (inverting) input, a positive (non-inverting) input, and an output 206a. Switch 254 is coupled between output 204 of voltage divider 204 and the negative input of amplifier 206. The bottom terminal (plate) of capacitor $C_{REF}$ is coupled to ground. Switch 255 is coupled between the negative input of amplifier 206 and capacitor $C_{REF}$. Switch 251 is coupled between the output 206a of amplifier 206 and capacitor $C_{REF}$. Switch 257 is coupled between the negative input of amplifier 206 and the amplifier's output 206a.

VCO 208 has an input 208a and an output 208b. The VCO's output 208b generates the output clock CLK_OUT at a frequency that is a function of the voltage at its input 208a. Output clock CLK_OUT can be used by an ADC (not shown). Switch 252 is coupled between the output 206a of amplifier 206 and the input 208a of VCO 208. The output 208b of the VCO is coupled to an input of frequency divider 210, which may divide down the frequency of the output clock CLK_OUT by a factor of, for example, 2. F2V converter 214 has an input 214a and an output 214b. The output of frequency divider 210 is coupled to the input 214a of F2V 214 and to an input of frequency divider 220 (which may divide down the frequency of the clock signal output by frequency divider 210 by a factor of, for example, 16). F2V converter (an example of which is provided in FIG. 3) produces an output voltage at its output 214b that is proportional to the frequency of the clock signal at its input 214a. The output 214b of F2V converter 214 is coupled to the positive input of amplifier 206.

The PFD 230 has a reference clock input 230a, a feedback clock input 230b, and an output 230c. The output of frequency divider 220 is coupled to the feedback clock input 230b of PFD 230. The reference clock input 230a receives the reference clock REFCLK (described above) that is transmitted over the communication bus 125 by the communication interface 160. The output 230c of PFD 230 is coupled to an input of CP 234. PFD 230 provides UP and DN (down) pulses to the input of CP 234, which causes the CP 234 to increase (in response to an UP pulse) or decrease (in response to a DN pulse) a voltage at the output 234a of CP 234. Switch 253 is coupled between the output 234a of CP 234 and the input 208a of VCO 208.

Capacitor C1 and resistor R1 are coupled in series between DVDD and the input 208a of VCO 208. Capacitor C2 is coupled in series between DVDD and the input 208a of VCO 208. The combination of capacitors C1 and C2 and resistor R1 forms a loop filter. Switch 256 is coupled across resistor R1.

Control circuit 202 includes control outputs 261, 262, and 263. Control circuit 202 may generate a control signal BASE_EN 271 at its control output 261, control signal PLL_EN 272 at its control output 262, and control signal ~PLL_EN 273 at its control output 263. Control signal ~PLL_EN 273 is the logical inverse of control signal PLL_EN 272, Each switch 251-257 has a switch control input coupled to one of the control outputs 261, 262, and 263 of control circuit 202. The connection between the switch control input of each switch and the control circuit's control outputs is indicated in FIG. 2 by the control signal names adjacent to each switch. In this example, the switch control input of switch 254 is coupled to control output 261. Accordingly, switch 254 is closed (enabled) in response to the logic state of control signal BASE_EN 271 being logic high and is opened (disabled) in response to the logic state of control signal BASE_EN 271 being logic low. The switch control input of switches 252, 255, and 256 are coupled to control output 263. Accordingly, switches 252, 255, and 256 are closed (enabled) in response to the logic state of control signal ~PLL_EN 273 being logic high and are opened (disabled) in response to the logic state of control signal ~PLL_EN 273 being logic low. The switch control input of switches 251, 253, and 257 are coupled to control output 262. Accordingly, switches 251, 253, and 257 are closed (enabled) in response to the logic state of control signal PLL_EN 272 being logic high and are opened (disabled) in response to the logic state of control signal PLL_EN 272 being logic low. The control circuit 202 controls the logic states of control signals BASE_EN 271, PLL_EN 272, and ~PLL_EN 273 to cause the oscillator circuit 201 to be configured in three different modes—the base mode, the FLL mode, and the PLL mode.

Figure 3:
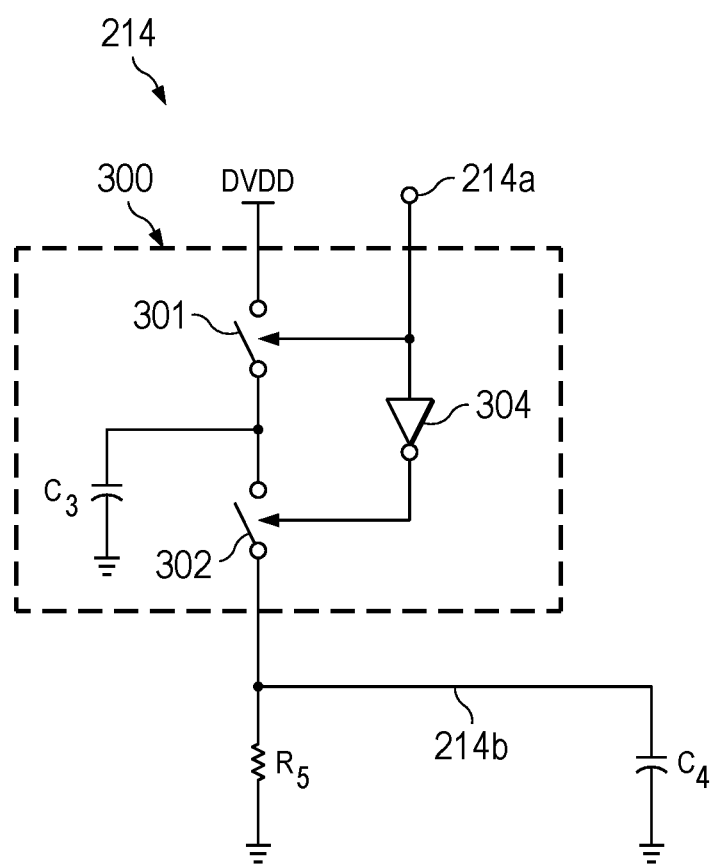
FIG. 3 is a schematic diagram of an example frequency-to-voltage converter within the oscillator circuit of FIG. 2.

FIG. 3 is a schematic diagram of an example F2V converter 214. The F2V converter 214 in this example includes a switched-capacitor resistor 300 coupled to resistor $R_5$ and capacitor C4. Switched capacitor resistor 300 includes an inverter 304, a capacitor $C_3$ and switches 301 and 302. Switch 301 is coupled between DVDD and one terminal of capacitor $C_3$, and the other terminal of capacitor $C_3$ is coupled to ground. Switch 302 is coupled between capacitor $C_3$ and resistor $R_5$ and capacitor $C_4$. F2V converter input 214a is coupled to the input of inverter 304 and to a switch control input of switch 301. The output of inverter 304 is coupled to a switch control input of switch 302. Accordingly, when the clock signal provided at the input 214a is at one logic state (e.g., logic high), switch 301 closes and switch 302 opens, and when the clock signal is at the opposite logic state (e.g., logic low), switch 301 opens and switch 302 closes. The F2V converter's output 214b is coupled to resistor $R_5$ and capacitor $C_4$ and provides the output voltage Vout from the F2V converter 214.

The equivalent resistance ($R_{eq}$) of switched-capacitor resistor 300 is proportional to $1/(C_3 * f)$, where f is the frequency of the clock signal at input 214a. The F2V converter 214 in FIG. 3 represents a resistor divider in which the output voltage Vout is a product of the power supply voltage DVDD and the ratio of the sum of $R_5$ and ($R_5 + R_{eq}$), that is:

$$Vout = DVDD * \left(\frac{R_5}{R_5 + R_{eq}}\right) \quad (1)$$

Accordingly, a higher frequency, f, results in $R_{eq}$ being smaller and thus Vout being larger, and a lower frequency, f, results in $R_{eq}$ being larger and Vout being smaller. Thus, the magnitude of Vout is proportional to frequency, f.

Figure 4:
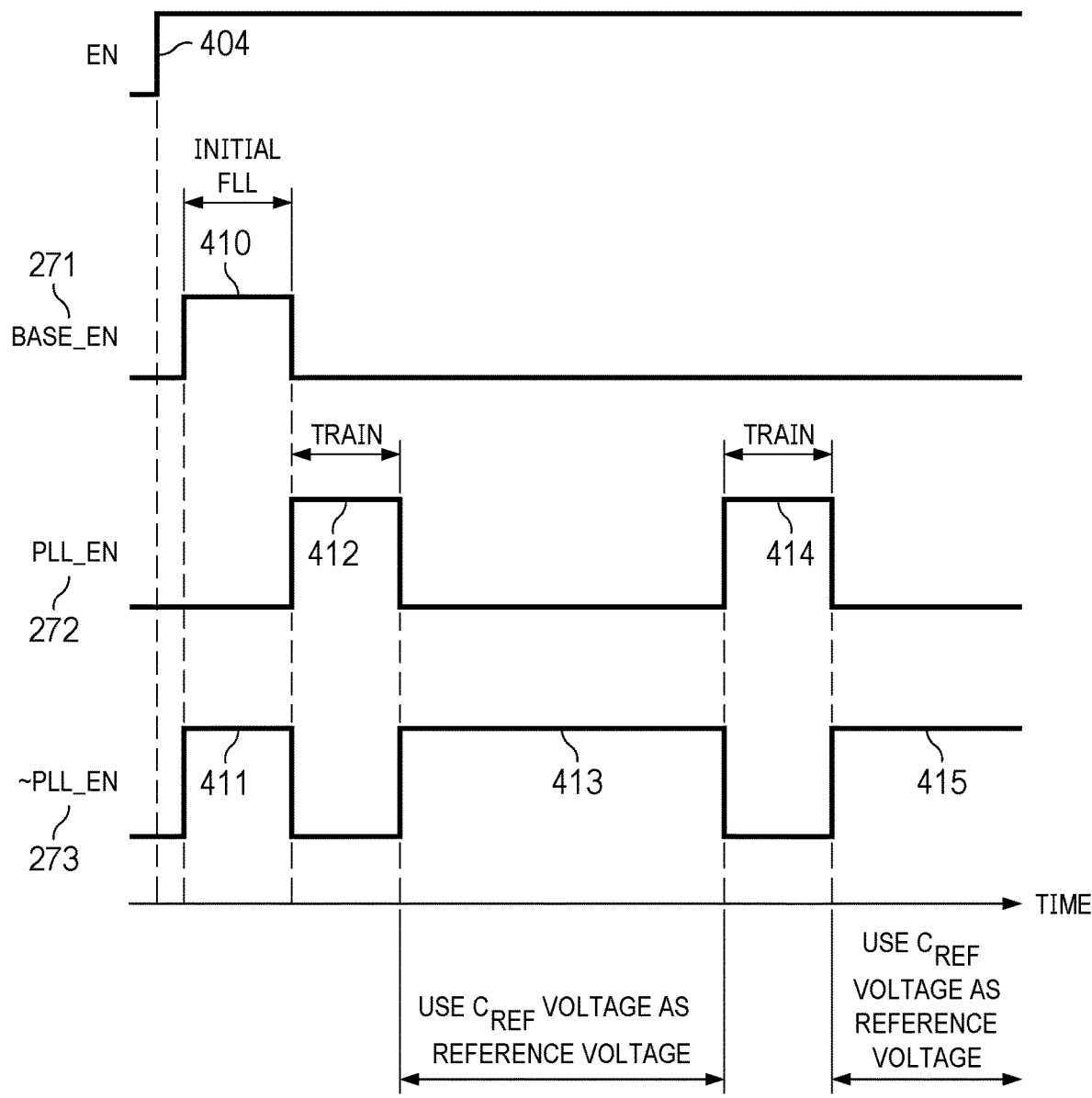
FIG. 4 is an example timing diagram illustrating the base, frequency-locked loop, and training/phase-locked loop phases of operation of the monitors.

FIG. 4 is a timing diagram illustrating the base, FLL, and PLL modes of operation of the oscillator circuit 201 of each cell monitor 105 and pack monitor 130. Upon power-up/initialization, the cell monitor or pack monitor asserts an internal enable (EN) signal. The rising edge (404) assertion of the enable EN signal causes the control circuit 202 to assert the control signal BASE_EN 271 and the control signal ~PLL_EN 273 to a logic high state (410 and 411, respectively). In response to the logic high assertion of control signals BASE_EN 271 and ~PLL_EN 273, switches 252, 254, 255, and 256 close and switches 251, 253, and 257 are opened. In this switch state, oscillator circuit 201 is configured to operate as a FLL in which the input control voltage to the negative input of amplifier 206 is provided by the voltage divider 204. The output 206a of amplifier 206 is coupled to the input 208a of VCO 208. VCO 208 responds to the voltage supplied to it by amplifier 206 by producing the clock output CLK_OUT at a frequency that is proportional to the input control voltage provided by the voltage divider 204 relative to the output voltage from the F2V converter 214. The oscillator circuits 201 of the cell monitors 105 and pack monitor 130 initialize into the base mode in which the oscillator operates as an FLL.

From that point on, each oscillator circuit 201 operates as a PLL (also referred to as a training mode) or as an FLL. FIG. 4 illustrates training modes in which control circuit 202 asserts control signal PLL_EN 272 to a logic high state as shown at 412 and 414. In between training modes, the control circuit 202 asserts control signal ~PLL_EN 273 to a logic high state as illustrated at 413 and 415. During each training mode, the oscillator circuit 201 is configured to operate as a PLL using the reference clock provided by communication interface 160 as an input clock to the reference clock input 230a of the PFD 230. In the training mode, the oscillator circuit 201 resynchronizes the output clock CLK_OUT to the reference clock provided by communication interface 160. The resynchronized clock frequency is converted to a voltage by the F2V converter 214 and "stored" as a voltage across capacitor $C_{REF}$. When control signal ~PLL_EN 273 is asserted logic high, the oscillator circuit 201 is configured to operate as an FLL with the voltage across capacitor $C_{REF}$ as a reference voltage connected to the negative input of amplifier 206 and uses the newly resynchronized output clock CLK_OUT to, for example, operate the ADC as explained above. The base, FLL, and PLL/training modes are further explained below.

Figure 5:
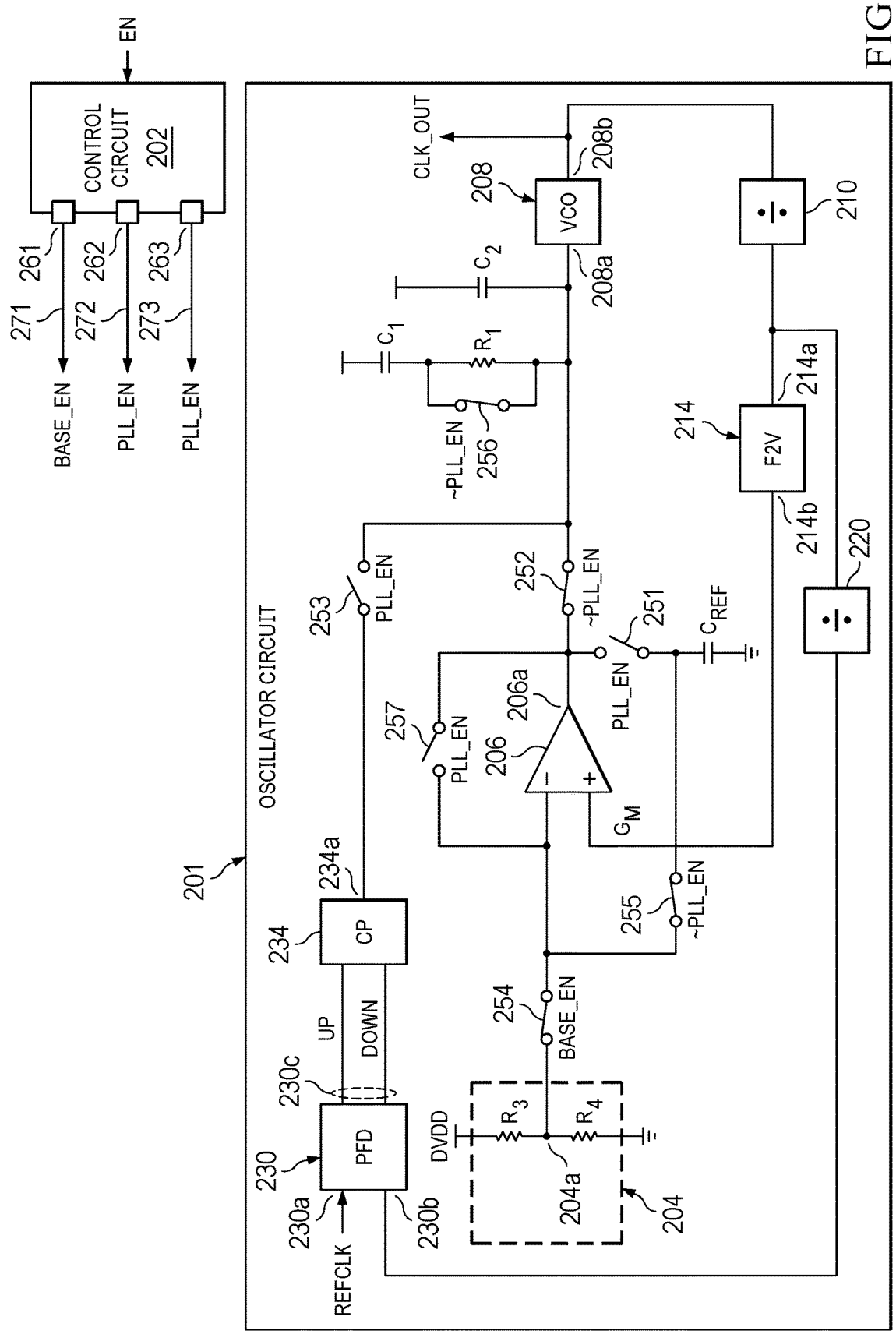
FIG. 5 is a schematic diagram of the example configurable oscillator circuit of FIG. 2 configured for the base phase of operation.

FIG. 5 is a schematic diagram of oscillator circuit 201 as configured for the base mode. In the base mode, the control circuit 202 asserts (e.g., logic high) the control signals BASE_EN 271 and ~PLL_EN 273 and deasserts (e.g., logic low) the control signal PLL_EN 272. In response, switches 252, 254, 255, and 256 close (as visually shown in FIG. 5) while switches 251, 253, and 257 are open to configure oscillator circuit 201 as an FLL. With switch 253 open, PFD 230 and CP 234 are disconnected from the input 208a of VCO 208. The output 204a of voltage divider 204 is connected to the negative input of amplifier 206. A control loop forms including amplifier 206, VCO 208, frequency divider 210, and F2V converter 214. The FLL implemented by this control loop produces the output clock CLK_OUT having a frequency that is a function of the control voltage from the output 204a of voltage divider 204. Further, with switch 255 closed, the control voltage from the voltage divider is applied to capacitor $C_{REF}$ thereby precharging capacitor $C_{REF}$ to the control voltage from the voltage divider.

Figure 6:
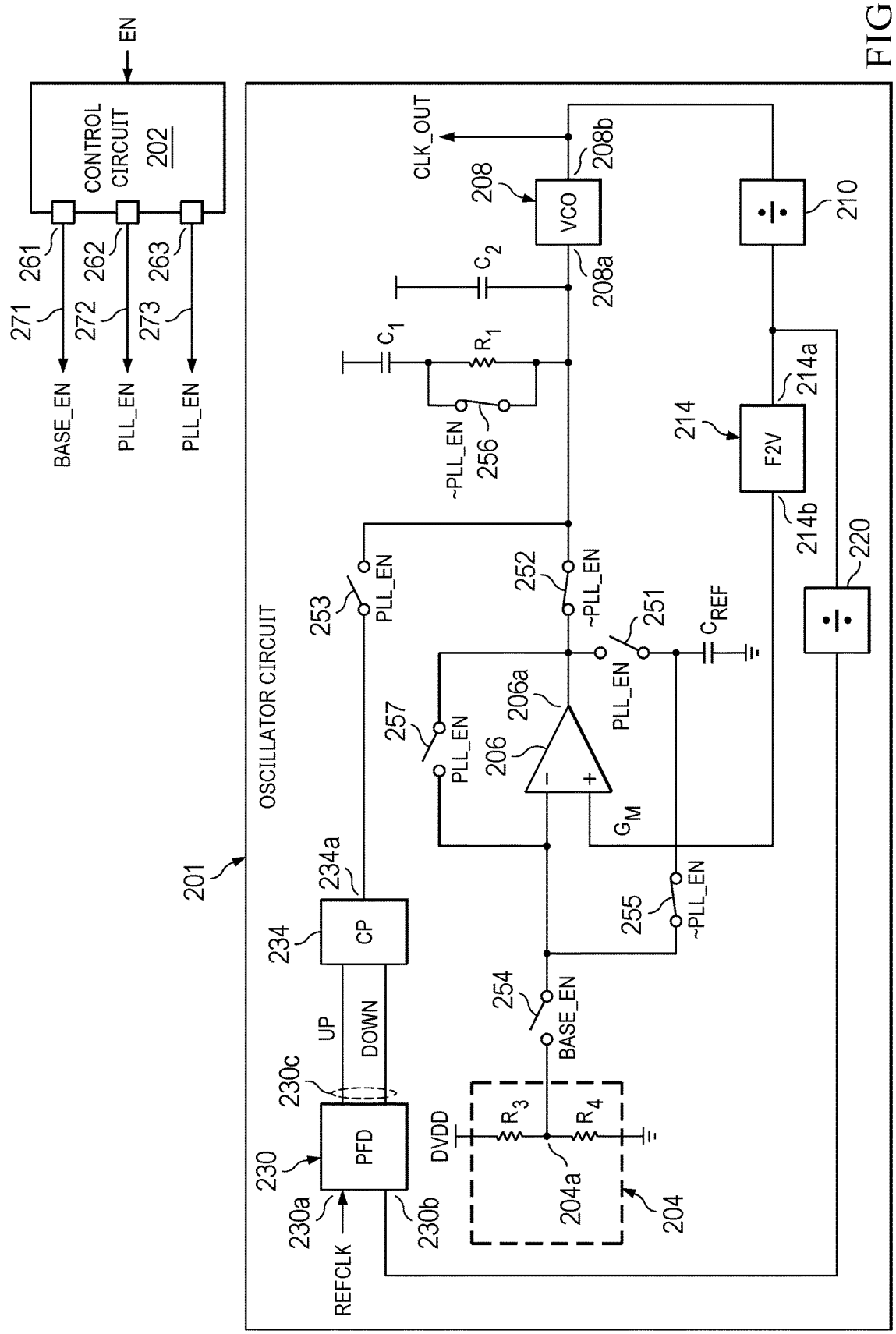
FIG. 6 is a schematic diagram of the example configurable oscillator circuit of FIG. 2 configured for the frequency-locked loop phase of operation.

FIG. 6 is a schematic diagram of oscillator circuit 201 as configured for the FLL mode. In the FLL mode, the control circuit 202 asserts (e.g., logic high) the control signal ~PLL_EN 273 and deasserts control signals BASE_EN 271 and PLL_EN 272. In response, switches 252, 255, and 256 close (as visually shown in FIG. 6) while switches 251, 253, 254, and 257 are open to configure oscillator circuit 201 as an FLL. In both the base and FLL modes, the oscillator circuit 201 is configured as an FLL but in the FLL mode of FIG. 6, the control voltage for the FLL is provided to the negative input of amplifier 206 from capacitor $C_{REF}$ via switch 255, rather than from the voltage divider 204. A similar control loop forms with the switches in this configuration. Such control loop includes amplifier 206, VCO 208, frequency divider 210, and F2V converter 214.

Figure 7:
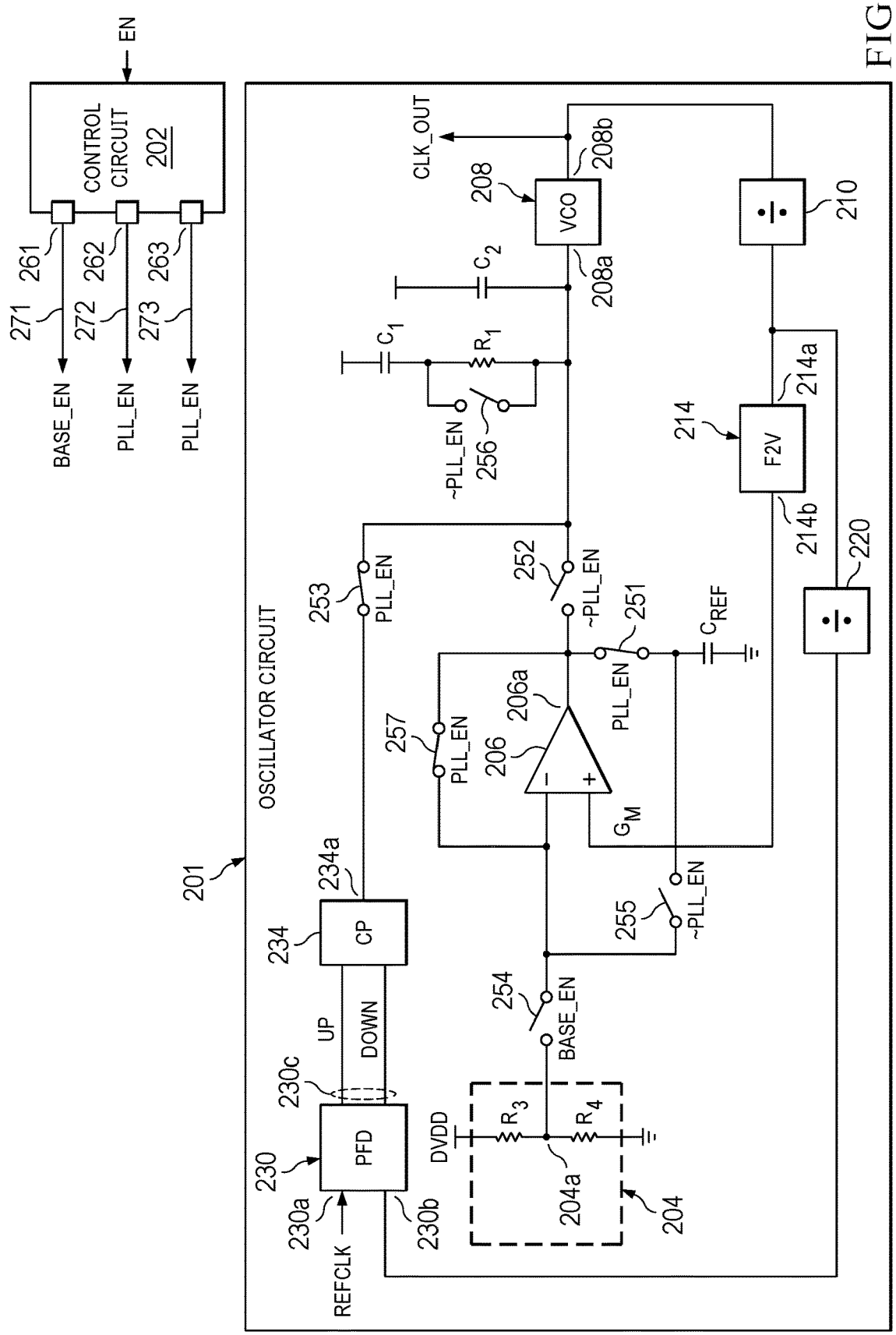
FIG. 7 is a schematic diagram of the example configurable oscillator circuit of FIG. 2 configured for the training/phase-locked loop phase of operation.

FIG. 7 is a schematic diagram of oscillator circuit 201 as configured for the PLL (training) mode. In the PLL mode, the control circuit 202 asserts (e.g., logic high) the control signal PLL_EN 272 and deasserts control signals BASE_EN 271 and ~PLL_EN 273. In response, switches 251, 253, and 257 close (as visually shown in FIG. 7) while switches 252, 254, 255, and 256 are open to configure oscillator circuit 201 as a PLL. With the switches in this state, the output 234a of CP 234 can provide its output voltage to the input 208a of VCO 208, and the output 206a of amplifier 206 ceases providing its output voltage to the VCO. A control loop forms in this mode which includes PFD 230, CP 234, VCO 208, and frequency dividers 210 and 220. In this mode, the PLL implemented by oscillator circuit 201 is phase and frequency aligned to the phase and frequency of the reference clock REFLK provided by the communication interface 160 via the communication bus 125.

Further, by closing switch 257, amplifier 206 is configured as a unity gain buffer. The output 214b of the F2V converter 214 is coupled to the positive input of amplifier 206, and thus the amplifier's output 206a provides a voltage approximately equal to the output voltage from the F2V converter. With switch 251 closed, the output voltage from amplifier 206 is applied to capacitor CREF to thereby charge capacitor CREF to the output voltage from the F2V converter 214. Because the output voltage from the F2V converter 214 is proportional to the frequency of the output clock CLK_OUT, capacitor CREF is charged to a voltage proportional to the frequency of the output clock CLK_OUT, which in the PLL mode is phase and frequency aligned to the reference clock REFCLK. Then, in the next FLL mode, switch 255 closes and the voltage on capacitor CREF is used as the reference voltage for the FLL implemented by the oscillator circuit 201.

Figure 8:
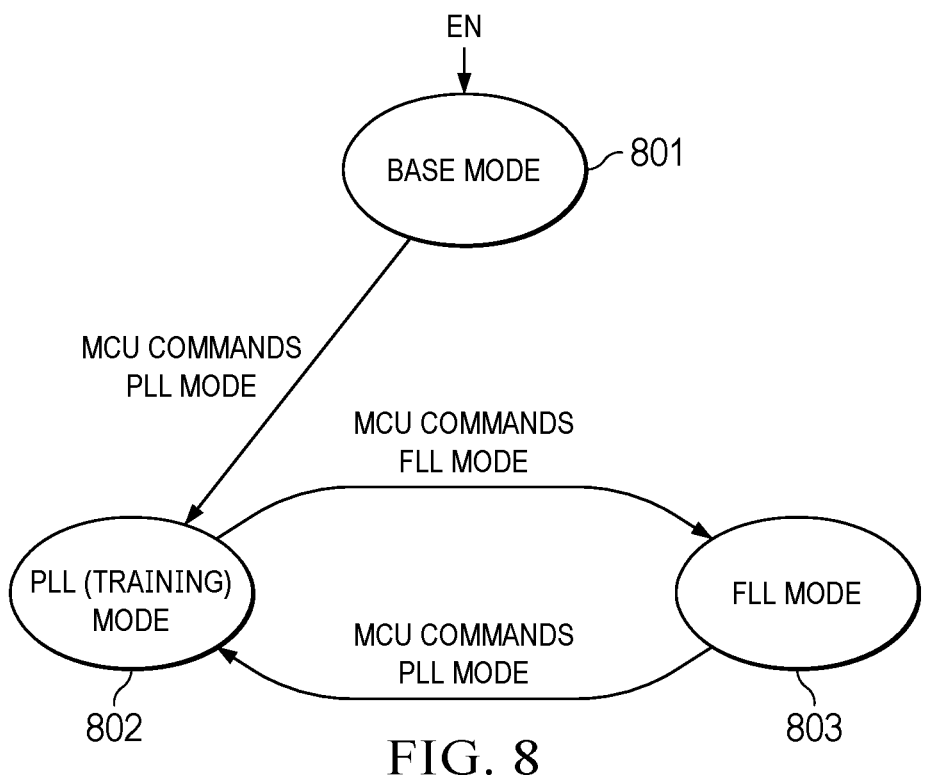
FIG. 8 is an example state diagram implemented by the control circuit of the configurable oscillator circuit.

FIG. 8 is a state diagram illustrating the operation of control circuit 202. The state diagram of FIG. 8 includes three states 801, 802, and 803 corresponding to the base, PLL, and FFL modes of operation, respectively, of each oscillator circuit 201. The base mode state 801 is entered upon power-up/initiation in response to an assertion of an internal enable EN signal, as described above. While in the base mode state, control circuit 201 asserts (e.g., logic high) the control signals BASE_EN 271 and ~PLL_EN 273 and deasserts (e.g., logic low) the control signal PLL_EN 272. When the MCU 150 does not need the communication bus 125 to communicate with any devices on the bus, the MCU 150 can then command the control circuit 201 to transition to the PLL (training) mode state 802. In the PLL (training) mode state, the control circuit 202 asserts (e.g., logic high) the control signal PLL_EN 272 and deasserts control signals BASE_EN 271 and ~PLL_EN 273. The MCU 150 can then command the control circuit 201 to transition from PLL (training) mode state 802 to the FLL mode state 803. In the FLL mode, the control circuit 202 asserts (e.g., logic high) the control signal ~PLL_EN 273 and deasserts control signals BASE_EN 271 and PLL_EN 272. The MCU 150 can command the control circuit 201 to transition back and forth between states 802 and 803. Each time the control circuit 201 is in PLL (training) mode state, the oscillator circuit 201 is configured as a PLL and resynchronizes the phase and frequency of the output clock CLK_OUT to the reference clock REFCLK from the communication interface 160.

In one example, during each 100 ms time interval, the MCU 150 may use the communication bus 125 to communicate with one or more devices on the bus (e.g., reading battery cell voltage digital values from the ADCs of the various battery cell monitors) for 90 ms, for example. During the 10 ms that the MCU 150 does not need the communication bus, the MCU can issue a command to the battery cell monitors 110 and pack monitor 130 to transition to their PLL (training) modes for clock phase and frequency synchronization. In some cases, the MCU 150 causes the battery cell monitors 110 and pack monitor 130 to transition to their PLL (training) modes during each idle time that the communication bus 125 is not being used for commands or data. In other cases, MCU can skip one or more idle times without causing the battery cell monitors 110 and pack monitor 130 to transition to their PLL (training) modes.

Figure 9:
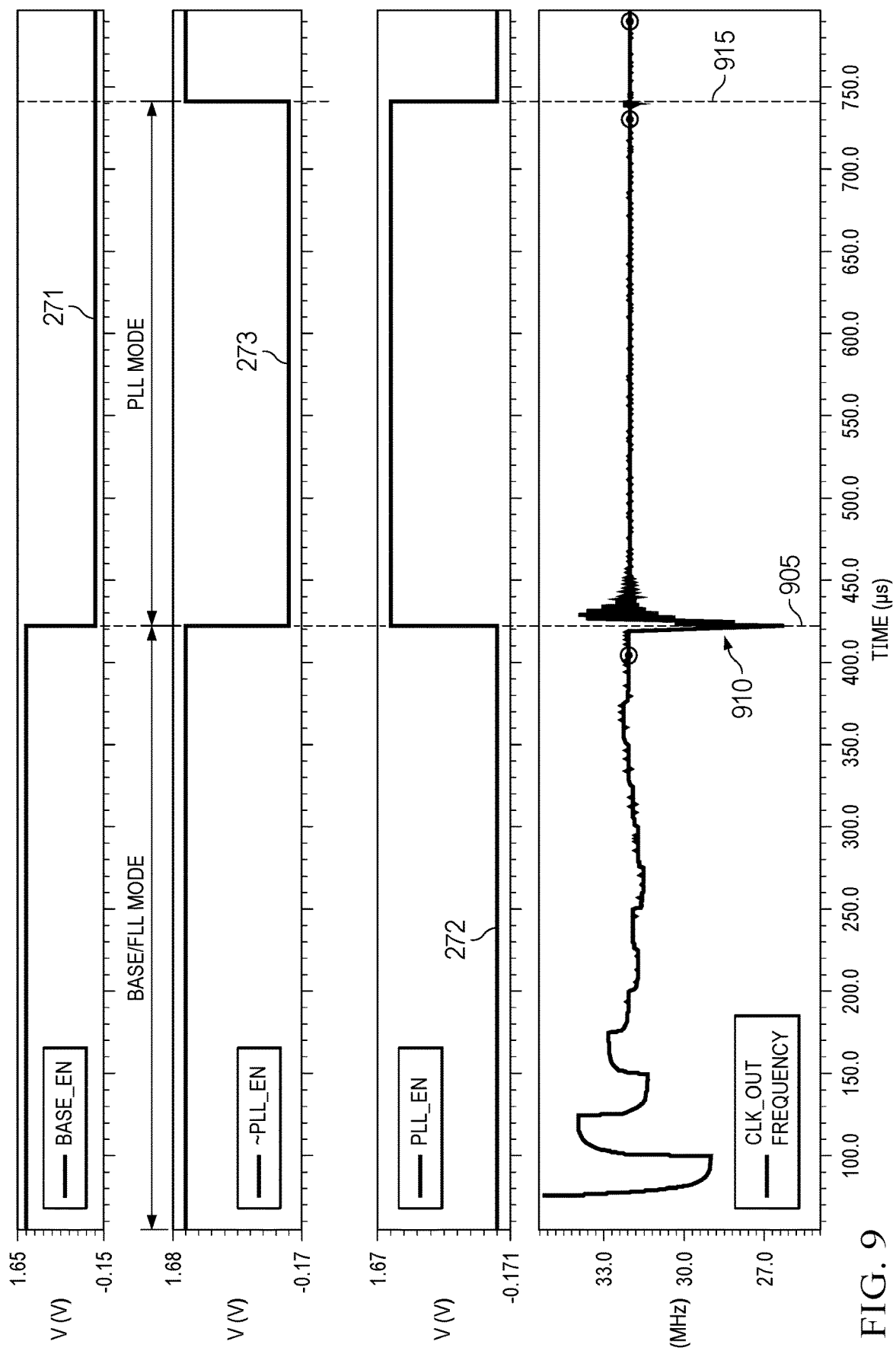
FIG. 9 includes example waveforms illustrating the transition between the base or frequency-locked loop phases and the training/phase-locked loop phase.

FIG. 9 includes example waveforms illustrating the transition between the base or frequency-locked loop phases and the training/phase-locked loop phase. The control signals BASE_EN 271, ~PLL_EN 273, and PLL_EN 272 are shown as well as the frequency of the output clock CLK_OUT. In the initial base/FLL mode, both the control signals BASE_EN 271 ~PLL_EN 273 are logic high and control signal PLL_EN 272 is logic low. With the control signals in this state, the oscillator circuit 201 is configured as an FLL with its control voltage provided by the voltage divider 204. The frequency of the output clock CLK_OUT settles to its target value of approximately 32 MHz in this example. At time point 905, the control circuit 201 transitions to the PLL mode in which the control signal PLL_EN 272 is logic high and the control signals BASE_EN 271 and ~PLL_EN 273 are logic low. The output clock frequency may experience a transient 910 before it settles again at the target frequency of approximately 32 MHz. At time point 915, the control circuit 201 transitions to the FLL mode in which the control signal ~PLL_EN 273 is logic high and the control signals BASE_EN 271 and PLL_EN 272 are logic low. In this mode, the oscillator circuit is configured as an FLL and uses the voltage across capacitor $C_{REF}$ as its control voltage.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. An integrated circuit (IC), comprising:
   an oscillator circuit having a control input and a capacitor; and
   a control circuit having a control output coupled to the control input, the control circuit configured to generate a control signal to the control input of the oscillator circuit to cause:
      the oscillator circuit to be configured as a first frequency-locked loop in response to the control signal being in a first state, wherein the capacitor is charged during the first state;
      the oscillator circuit to be configured as a second frequency-locked loop in response to the control signal being in a second state, wherein the second frequency-locked loop is configured to receive a voltage from the capacitor; and
      the oscillator circuit to be configured as a phase-locked loop in response to the control signal being in a third state.

2. The IC of claim 1, wherein the oscillator circuit comprises:
   an amplifier;
   a voltage-controlled oscillator (VCO);
   a first switch having a first switch control input, the first switch coupled between the amplifier and the VCO;
   a phase-frequency detector (PFD); and
   a second switch having a second switch control input, the second switch coupled between the PFD and the VCO.

3. The IC of claim 2, further comprising a charge pump coupled between the PFD and the second switch.

4. The IC of claim 2, wherein the control circuit has a first control output and a second control output, the first control output coupled to the first switch control input, and the second control output coupled to the second switch control input.

5. The IC of claim 2, wherein the amplifier has an amplifier output, and the oscillator circuit further comprises:
   a capacitor; and
   a third switch coupled between amplifier output and the capacitor.

6. The IC of claim 5, wherein the amplifier has an amplifier input, the VCO has a VCO output, and the oscillator circuit further comprises a frequency-to-voltage converter coupled between the VCO output and the amplifier input.

7. The IC of claim 5, wherein the amplifier has an input, and the oscillator circuit further comprises:
   a fourth switch coupled between the input of the amplifier and the capacitor.

8. The IC of claim 7, further comprising:
   a voltage divider having a voltage divider output; and
   a fifth switch coupled between the voltage divider output and the input of the amplifier.

9. An integrated circuit (IC), comprising:
   an amplifier;
   a voltage-controlled oscillator (VCO);
   a first switch having a first switch control input, the first switch coupled between the amplifier and the VCO;
   a phase-frequency detector (PFD);

a second switch having a second switch control input, the second switch coupled between the PFD and the VCO; and a control circuit having a first control output and a second control output, the first control output coupled to the first switch control input, and the second control output coupled to the second switch control input.

10. The IC of claim 9, further comprising a charge pump coupled between the PFD and the second switch.

11. The IC of claim 9, wherein the amplifier has an amplifier output, and the control circuit further comprises:
a capacitor; and
a third switch coupled between amplifier output and the capacitor.

12. The IC of claim 11, wherein the amplifier has an amplifier input, the VCO has a VCO output, and the control circuit further comprises a frequency-to-voltage converter coupled between the VCO output and the amplifier input.

13. The IC of claim 11, wherein the amplifier has an input, and the control circuit further comprises:
a fourth switch coupled between the input of the amplifier and the capacitor.

14. The IC of claim 13, further comprising:
a voltage divider having a voltage divider output; and
a fifth switch coupled between the voltage divider output and the input of the amplifier.

15. The IC of claim 14, wherein the fifth switch has a fifth switch control input, and the control circuit has a third control output coupled to the fifth switch control input.

16. An integrated circuit (IC), comprising:
an amplifier having an amplifier output;
a capacitor;
a first switch coupled between the amplifier output and the capacitor;
a voltage-controlled oscillator (VCO) having a VCO input and a VCO output;
a second switch coupled between the amplifier output and the VCO input;
a frequency-to-voltage (F2V) converter having a converter input and a converter output, the converter input coupled to the VCO output;
a phase-frequency detector (PFD) having a PFD output;
a charge pump (CP) having a CP input and a CP output, the CP Input coupled to the PFD output; and
a third switch coupled between the CP output and the VCO input.

17. The IC of claim 16, wherein the amplifier has a first amplifier input and a second amplifier input, the IC further comprising:
a voltage divider network having an output; and
a fourth switch coupled between the output of the voltage divider network and the first amplifier input.

18. The IC of claim 17, wherein the first switch has a first switch control input, the second switch has a second switch control input, the third switch has a third switch control input, and the fourth switch has a fourth switch control input, and the IC further comprises a control circuit that has a first control output, a second control output, and a third control output, the first control output coupled to the first switch control input and the third switch control input, the second control output coupled to the second switch control input, and the third control output coupled to the fourth switch control input.

19. The IC of claim 18, further comprising a fifth switch coupled between the first amplifier input and the capacitor.

20. The IC of claim 19, wherein the fifth switch has a fifth control input coupled to the second control output of the control circuit.

* * * * *